(12) United States Patent
Chen et al.

(10) Patent No.: US 11,139,277 B2
(45) Date of Patent: Oct. 5, 2021

(54) SEMICONDUCTOR DEVICE INCLUDING CONTACT FINGERS ON OPPOSED SURFACES

(71) Applicant: WESTERN DIGITAL TECHNOLOGIES, INC., San Jose, CA (US)

(72) Inventors: Chien Te Chen, Taichung (TW); Cong Zhang, Shanghai (CN); Hsiang Ju Huang, Taichung (TW); Xuyi Yang, Shanghai (CN); Yu Ying Tan, Taichung (TW); Han-Shiao Chen, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/814,864

(22) Filed: Mar. 10, 2020

(65) Prior Publication Data

US 2020/0411478 A1 Dec. 31, 2020

(30) Foreign Application Priority Data

Jun. 28, 2019 (CN) .......................... 201910578954.3

(51) Int. Cl.
*H01L 25/18* (2006.01)
*H01L 25/065* (2006.01)
(Continued)

(52) U.S. Cl.
CPC ........ *H01L 25/0657* (2013.01); *H01L 21/561* (2013.01); *H01L 21/565* (2013.01);
(Continued)

(58) Field of Classification Search
CPC ..... H01L 25/0657; H01L 25/18; H01L 25/50; H01L 21/561; H01L 21/565;
(Continued)

(56) References Cited

U.S. PATENT DOCUMENTS 8,368,192 B1 * 2/2013 Chen ................. H01L 23/49531
257/676
9,673,183 B2 6/2017 Lim
(Continued)

FOREIGN PATENT DOCUMENTS

| CN | 104769713 | 12/2017 |
| WO | 2018058359 | 4/2018 |
| WO | 2018111253 | 6/2018 |

*Primary Examiner* — Timor Karimy
(74) *Attorney, Agent, or Firm* — Vierra Magen Marcus LLP

(57) ABSTRACT

A land grid array semiconductor device is disclosed which is configured for removable insertion to and from a host device. The land grid array semiconductor device may include a first set of one or more contact fingers on the first surface of the land grid array semiconductor device, and a second set of one or more contact fingers on the second surface of the land grid array semiconductor device. In order to electrically couple the second set of one or more contact fingers, one or more electrical connectors may be provided physically extending between the second set of one or more contact fingers and at least one of the substrate and the at least one semiconductor die.

16 Claims, 5 Drawing Sheets

(51) Int. Cl.
*H01L 23/31* (2006.01)
*H01L 23/00* (2006.01)
*H01L 25/00* (2006.01)
*H01L 21/56* (2006.01)
*H01L 23/498* (2006.01)

(52) U.S. Cl.
CPC .... *H01L 23/3121* (2013.01); *H01L 23/49811* (2013.01); *H01L 24/16* (2013.01); *H01L 24/48* (2013.01); *H01L 25/18* (2013.01); *H01L 25/50* (2013.01); *H01L 2224/48091* (2013.01); *H01L 2224/48106* (2013.01); *H01L 2224/48145* (2013.01); *H01L 2224/48227* (2013.01); *H01L 2225/0651* (2013.01); *H01L 2225/06506* (2013.01); *H01L 2225/06517* (2013.01); *H01L 2225/06548* (2013.01); *H01L 2225/06562* (2013.01); *H01L 2225/06582* (2013.01); *H01L 2924/14511* (2013.01)

(58) Field of Classification Search
CPC ........... H01L 23/3121; H01L 23/49811; H01L 24/16; H01L 24/48; H01L 2224/48091; H01L 2224/48106; H01L 2224/48145; H01L 2224/48227; H01L 2225/06506; H01L 2225/0651; H01L 2225/06517; H01L 2225/06548; H01L 2225/06562; H01L 2225/06582
See application file for complete search history.

(56) References Cited

U.S. PATENT DOCUMENTS

| | | |
|---|---|---|
| 2018/0261573 A1* | 9/2018 | Chen .................. H01L 21/6835 |
| 2018/0269190 A1 | 9/2018 | Nair et al. |
| 2019/0006339 A1 | 1/2019 | Lau et al. |
| 2019/0067258 A1 | 2/2019 | Kim et al. |

* cited by examiner

SEMICONDUCTOR DEVICE INCLUDING CONTACT FINGERS ON OPPOSED SURFACES

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where memory and controller dies are mounted and interconnected on a small footprint substrate. The substrate may in general include a rigid, dielectric base having a conductive layer etched on one or both sides. Electrical connections are formed between the dies and the conductive layer(s), and the conductive layer(s) provide an electric lead structure for connection of the dies to a host device. Once electrical connections between the dies and substrate are made, the assembly is then typically encased in a molding compound which provides a protective package.

It is known to provide so called LGA (land grid array) memory cards having contact fingers which enable the cards to be removably inserted into a host device. Upon insertion, pins in the host device slot engage the contact fingers to allow communication between the memory card and host device. Such cards include SD cards, Nano cards, Multimedia cards and SIM cards.

With the ever-present need to provide greater data capacity and transmission speed in smaller form factors, it is known to provide contact fingers across an entire surface of LGA cards. This presents challenges in the manufacture of the cards. For example, after formation of the contact fingers, components such as the controller die are mounted on the substrate over the contact fingers. Mounting of such components over the contact fingers can damage or crack the contact fingers.

DETAILED DESCRIPTION

Figure 1:
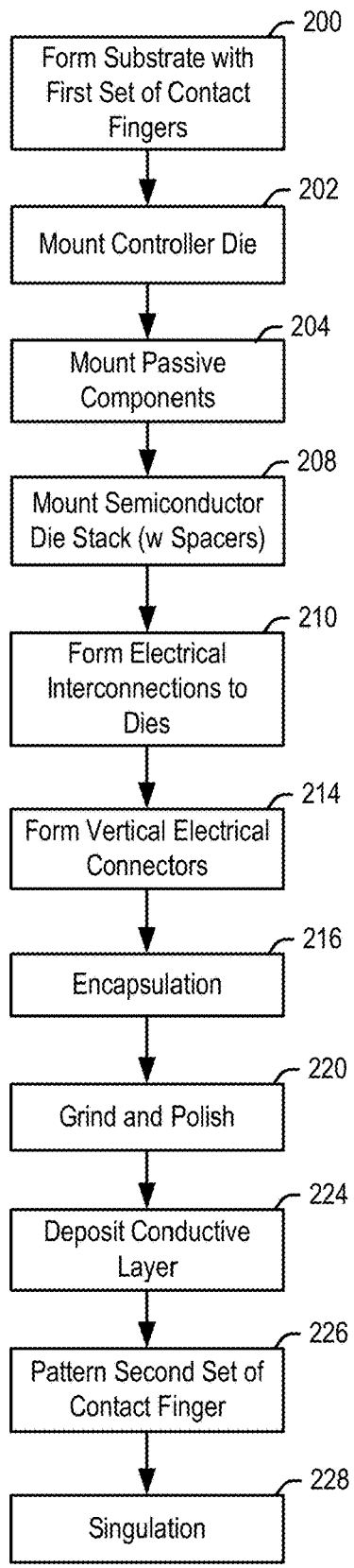
FIG. 1 is a flowchart of the overall fabrication process of a semiconductor device according to embodiments of the present technology.

The present technology will now be described with reference to the figures, which, in embodiments, relate to a land grid array semiconductor device configured for removable insertion to and from a host device. The land grid array semiconductor device may include a substrate, at least one semiconductor die mounted on the substrate and electrically coupled to the substrate and a molding compound encapsulating the at least one semiconductor die. The surface of the substrate and a surface of the molding compound define first and second opposed major surfaces of the land grid array semiconductor device.

In accordance with the present technology, a first set of one or more contact fingers may be formed on the first surface of the land grid array semiconductor device, and a second set of one or more contact fingers may be formed on the second surface of the land grid array semiconductor device. In order to electrically couple the second set of one or more contact fingers on the second surface of the land grid array semiconductor device, one or more electrical connectors may be provided physically extending between the second set of one or more contact fingers and at least one of the substrate and the at least one semiconductor die. The one or more electrical connectors may be formed by vertical wiring through the package, solder balls or columns or through mold vias (TMVs).

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±2.5%.

An embodiment of the present technology will now be explained with reference to the flowchart of FIG. 1 and the bottom, edge and top views of FIGS. 2 through 13. Although FIGS. 2 through 13 each show an individual semiconductor device 140, or a portion thereof, it is understood that the device 140 may be batch processed along with a plurality of other packages on substrate panels to achieve economies of scale. The number of rows and columns of devices 140 on the substrate panels may vary.

The substrate panel for the fabrication of semiconductor device 140 begins with a plurality of substrates 100 (again, one such substrate is shown in FIGS. 2 through 13). The substrate 100 may be a variety of different chip carrier mediums, including a printed circuit board (PCB), a leadframe or a tape automated bonded (TAB) tape. Where substrate 100 is a PCB, the substrate may be formed of a core having top and bottom conductive layers, and metal interconnections extending between the top and bottom layers. The core may be formed of various dielectric materials such as for example, polyimide laminates, epoxy resins including FR4 and FR5, bismaleimide triazine (BT), and the like. The conductive layers on the top and bottom surfaces may be formed of copper or copper alloys, plated copper or plated copper alloys, Alloy 42 (42Fe/58Ni), copper plated steel, or other metals and materials suitable for use on substrate panels.

FIG. 1 is a flowchart of the fabrication process for forming a semiconductor device 140 according to embodiments of the present technology. In a step 200, the substrate 100 may be formed including a first set of contact fingers 102 in a bottom surface 104 of the substrate, as shown in the bottom view of the semiconductor device 140 shown in FIG. 2. A layer of solder mask or other protective coating 106 may be formed on the bottom surface 104, leaving the contact fingers 102 exposed. The conductive layer on the bottom surface 104 of substrate 100 may be etched in various processes, such as for example photolithographic processes, to define contact fingers 102. Electrical traces and vias (not shown) may electrically couple the contact fingers 102 with contact pads on an upper surface of the substrate 100 (described below).

Figure 2:
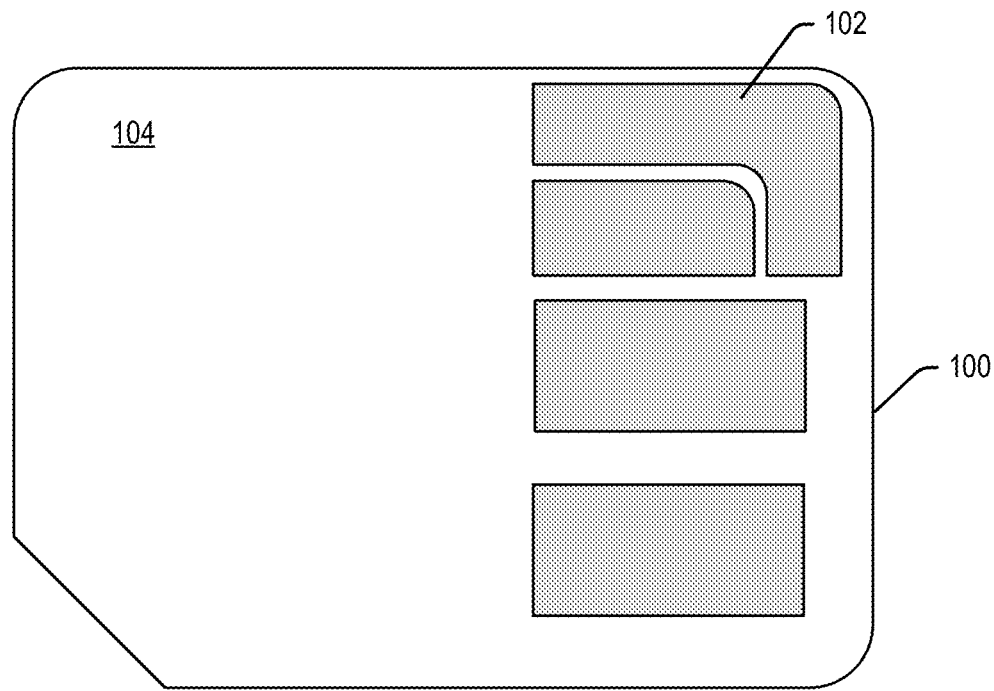
FIG. 2 is a bottom view of a substrate according to an embodiment of the present technology.
Figure 3:
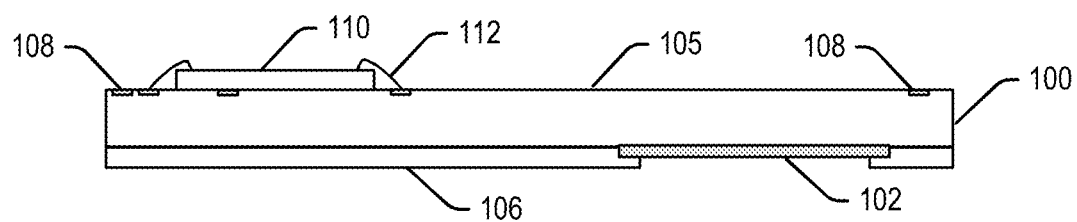
FIG. 3 is an edge view of a semiconductor device at a step during fabrication process according to an embodiment of the present technology.

The number, shape and relative positions of the contact fingers 102 shown in FIGS. 2 and 3 is by way of example only and may vary in further embodiments. The contact fingers 102 may be provided to support any of a wide variety of memory cards standards including for example multimedia cards (MMC), Nano cards, SIM cards, etc., and may be configured according to any of a wide variety of bus standards including for example SD and the peripheral component interconnect express (PCIe) bus standards.

In embodiments, the contact fingers 102 may be provided on one half of the bottom surface 104 of substrate 100 as shown in FIG. 2. However, it is conceivable that the contact fingers 102 be provided on the opposite half, on both halves, or distributed in a variety of other patterns, on the bottom surface 104 in further embodiments.

In embodiments, the conductive layer on an upper surface 105 of substrate 100 may be etched to define a pattern of contact pads 108 as shown in FIG. 3. Electrical traces and vias (not shown) may electrically couple the contact pads 108 with each other and the contact fingers 102 on the bottom surface 104 of the substrate 100. The contact pads 108 may be provided for receiving wire bonds, flip chip solder balls and a variety of other electrical contacts. The particular number and position of the contact pads 108 shown in FIG. 3 is a way of example only and may vary in further embodiments.

Figure 4:
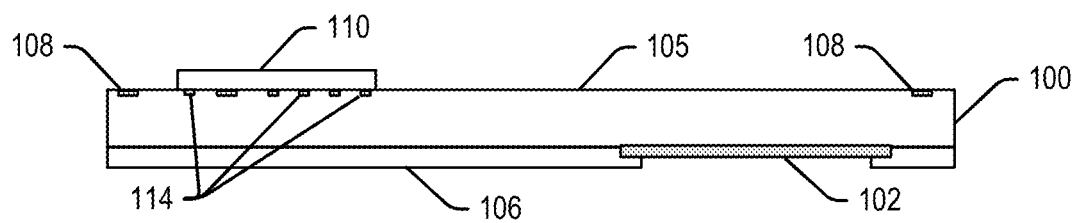
FIG. 4 is an edge view of a semiconductor device according to an alternative embodiment of the present technology at a step during fabrication process.

In step 202, a controller die 110 may be mounted to the upper surface 105 of the substrate 100 as shown in FIG. 3, and electrically coupled thereto for example using wire bonds 112. It is understood that the controller die 110 may be electrically coupled to the substrate 100 according to other schemes. For example, FIG. 4 illustrates an alternative embodiment where controller die 110 is flip-chip mounted to the substrate 100, for example using a pattern of contact pads 114. The controller die 110 may for example be an ASIC, but may be other semiconductor dies for interfacing with the host device in further embodiments.

In addition to controller die 110, passive components (not shown) may be mounted to the substrate in step 204. Such passive components may for example include capacitors, resistors and inductors.

Figure 5:
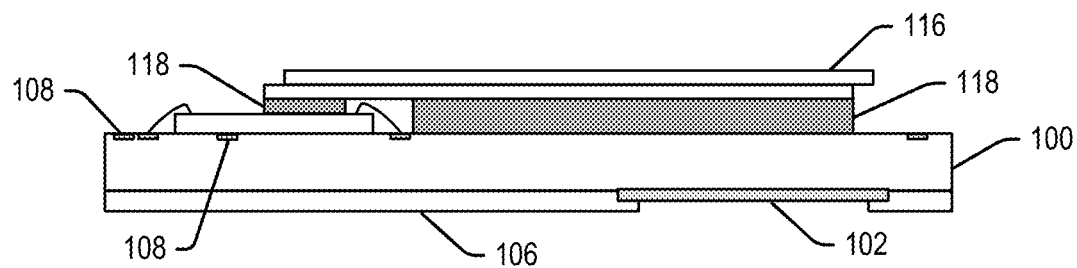
FIG. 5 is an edge view of a semiconductor device at a further step during fabrication process according to an embodiment of the present technology.
Figure 6:
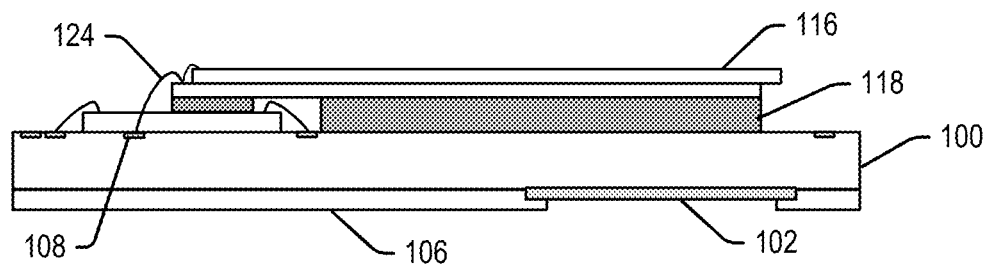
FIG. 6 is an edge view of a semiconductor device at another step during fabrication process according to an embodiment of the present technology.

In step 208, one or more additional semiconductor dies 116 may be mounted at the surface 105 of substrate 100 as shown for example in FIG. 5. The semiconductor dies 116 may for example be flash memory die such as 2D NAND flash memory or 3D BiCS (Bit Cost Scaling), V-NAND or other 3D flash memory, but other types of dies 116 may be used. These other types of semiconductor dies include but are not limited to RAM such as an SDRAM, DDR SDRAM, LPDDR and GDDR.

Where multiple semiconductor dies 116 are included, the semiconductor dies 116 may be stacked atop each other in any of a wide variety of configurations. In the example shown in FIGS. 5 and 6, a pair of semiconductor dies 116 may be mounted in step 208, and then electrically coupled to each other and the substrate in step 210, using for example wire bonds 124 coupled between die bond pads on the dies 116 and the contact pads 108 on the substrate 100 as shown in FIG. 6. Steps 208 and 210 may be repeated to vertically stack and wire bond additional pairs of offset semiconductor dies 116 to form a die stack 120 as shown for example in FIG. 7.

Figure 7:
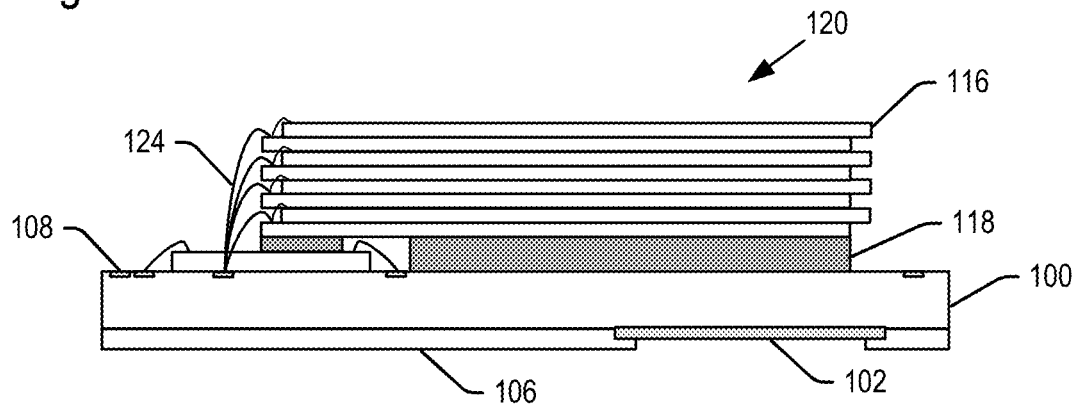
FIG. 7 is an edge view of a semiconductor device at a further step during fabrication process according to an embodiment of the present technology.

In the particular configuration of FIGS. 5-7, a film spacer layer (not shown) may be provided on top of each semiconductor die pair as is known to leave space for the wire bond to the upper die in the pair when the next pair of semiconductor dies are mounted. In a further configuration, the semiconductor dies 116 may be mounted, with each die 116 offset in the same direction, leaving the die bond pads of the die below exposed. This configuration takes up more space in the horizontal direction as compared to FIG. 7, but the film spacer layers may be omitted thereby taking up less space in the vertical direction as compared to FIG. 7.

Each die may include a die attach film (DAF) layer on a bottom surface. The dies 116 may be heated when stacked on each other and substrate 100, for example to 150° C., to soften the b-stage DAF layers and facilitate proper stacking. The number of dies 116 shown in the stack 120 in FIG. 7 is by way of example only, and embodiments may include different numbers of semiconductor dies, including for example 1, 2, 4, 8, 16, 32 or 64 dies. There may be other numbers of dies in further embodiments. It is also understood that the die stack 120 may be physically mounted in a variety of other offset configurations, and electrically coupled using technologies other than wire bonds, such as for example through silicon vias (TSV).

As is known, one or more spacers 118 may be provided to space the semiconductor dies 116 above the substrate 100 to leave room for the controller die 110 and its wire bonds. In further embodiments, the controller die 110 may be mounted within the substrate 100, next to the dies 116 on substrate 100 or on top of the dies 116. In such embodiments, the spacers 118 may be omitted.

Figure 8:
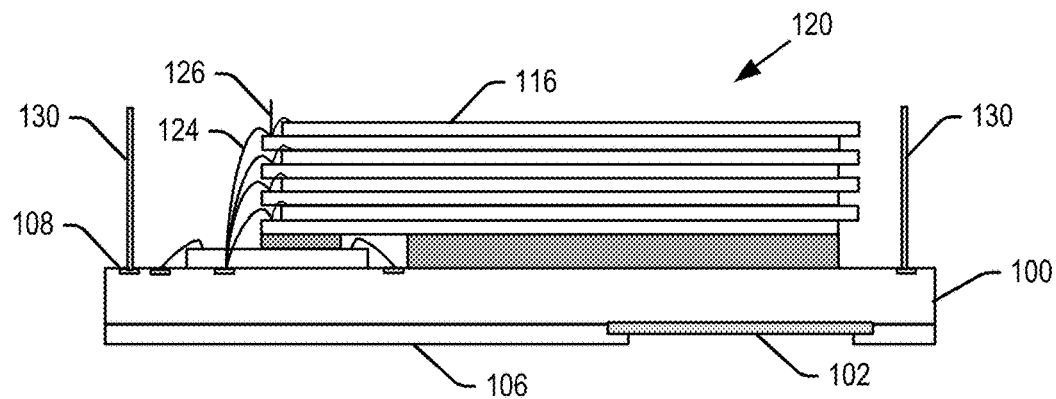
FIG. 8 is an edge view of a semiconductor device at another step during fabrication process according to an embodiment of the present technology.
Figure 9:
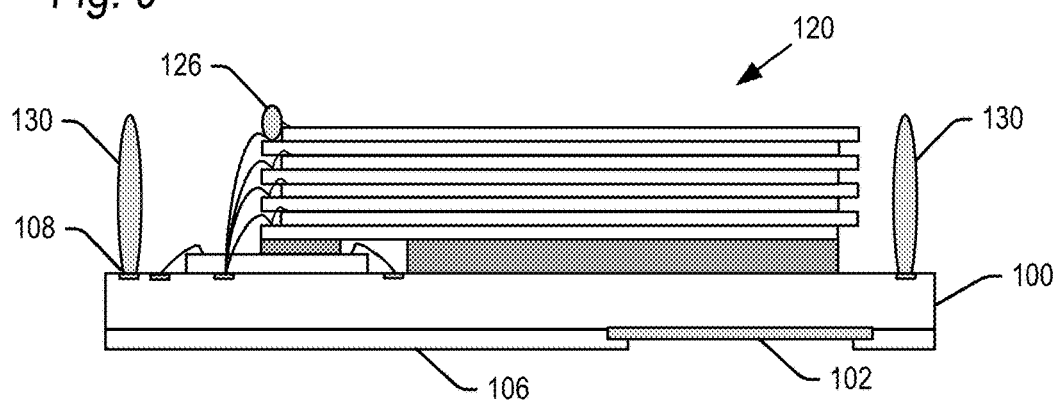
FIG. 9 is an edge view of a semiconductor device according to an alternative embodiment during fabrication process according to an embodiment of the present technology.

In accordance with aspects of the present technology, vertical electrical connectors 126 and 130 may next be formed in step 214 as shown in FIG. 8. The one or more vertical electrical connectors 126 may for example be formed extending vertically (i.e., generally perpendicular to surface 105 of substrate 100) from one or more die bond pads of one of the upper dies 116 in stack 120. There may be multiple such vertical electrical connectors 126 (into the page of FIG. 8). The one or more vertical electrical connectors 130 may for example be formed extending vertically from one or more contact pads 108 on substrate 100. There may be multiple such vertical electrical connectors 130 (into the page of FIG. 8).

FIG. 8 shows two sets of one or more vertical electrical connectors 130, at the left and right sides of the substrate 100. In further embodiments, there may be a single set of one or more vertical electrical connectors 130 extending from substrate 100, depending upon the contact fingers configuration on an upper surface of the semiconductor device as explained below. Also depending upon the configuration of contact fingers on the upper surface of the semiconductor device, either the one or more vertical electrical connectors 126 or the one or more vertical electrical connectors 130 may be omitted.

The vertical electrical connectors 126, 130 may be formed by a variety of technologies. In one embodiment, the vertical electrical connectors 126 and/or 130 may be formed by the same wire bond capillary (not shown) which forms wire bonds 124. In such embodiments, the vertical electrical connectors 126 and/or 130 may be formed of the same material as wire bonds 124, which may for example be Au or alloys thereof.

In a further embodiment, the vertical electrical connectors 126 and/or 130 may be formed as pillars or columns of solid material mounted on and extending from the semiconductor dies 116 and/or substrate 100. In a further embodiment shown in FIG. 9, the vertical electrical connectors 126 and/or 130 may be elongated solder balls, pillars or columns, or multiple solder balls, pillars or columns stacked on top of each other. In such embodiments, the vertical electrical connectors 126 and/or 130 may be formed of a variety of materials including for example Au, Cu, Sn or alloys thereof. The vertical electrical connectors 126, 130 may extend at least to a height of an upper surface of a mold compound formed over the semiconductor dies 116 as explained in the following paragraphs.

Figure 10:
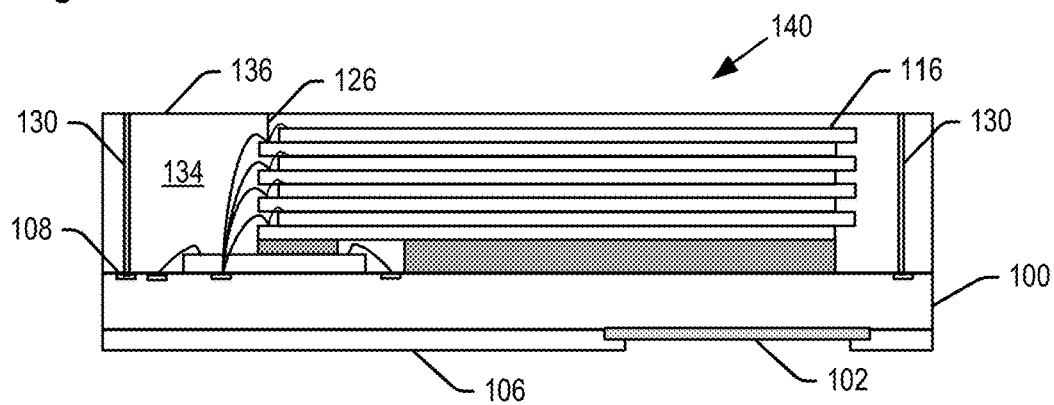
FIG. 10 is an edge view of a semiconductor device at a further step during fabrication process according to an embodiment of the present technology.

After the vertical electrical connectors 126, 130 are formed, the semiconductor dies 116 and electrical connectors 124, 126 and 130, also referred to as the semiconductor device 140, may be encapsulated in a mold compound 134 in a step 216 and as shown in FIG. 10. The semiconductor device 140 may be placed within a mold chase (not shown) comprising upper and lower mold plates. Molten mold compound 134 may then be injected into the mold chase to encase the components of the semiconductor device 140 in a protective enclosure in for example a compression molding process. Mold compound 134 may include for example solid epoxy resin, Phenol resin, fused silica, crystalline silica, carbon black and/or metal hydroxide. Other mold compounds are contemplated. The mold compound may be applied according to other known processes, including by FFT (flow free thin) molding, transfer molding or injection molding techniques.

In embodiments described above, the vertical electrical connectors 126, 130 are formed in step 214, and the electrical connectors and semiconductor dies 110, 116 are thereafter encapsulated in step 216. However, in a further embodiment, the semiconductor device 140 may be encapsulated before the vertical electrical connectors 126 and/or 130 are formed. In such embodiments, after encapsulation, the electrical connectors 126 and/or 130 may be formed by through mold vias (TMVs). The encapsulation is drilled, for example by a laser, down to a surface of the uppermost semiconductor die and/or substrate, and the drilled hole may then be plated and/or filled with an electrical conductor to form the vertical electrical connectors 126 and/or 130.

After the encapsulation step, a second set of contact fingers are formed on an upper surface of the mold compound 134, electrically coupled to the vertical electrical connectors 126 and/or 130. Formation of the second set of contact fingers will now be described with reference to steps 220-226 and FIGS. 11-13. In step 220, an upper surface 136 of the mold compound 134 may undergo a grinding and polishing process to reduce the thickness of the mold compound 134 for the purpose of exposing the vertical electrical connectors 126 and 130 at the upper surface 136 of the mold compound 134.

Figure 11:
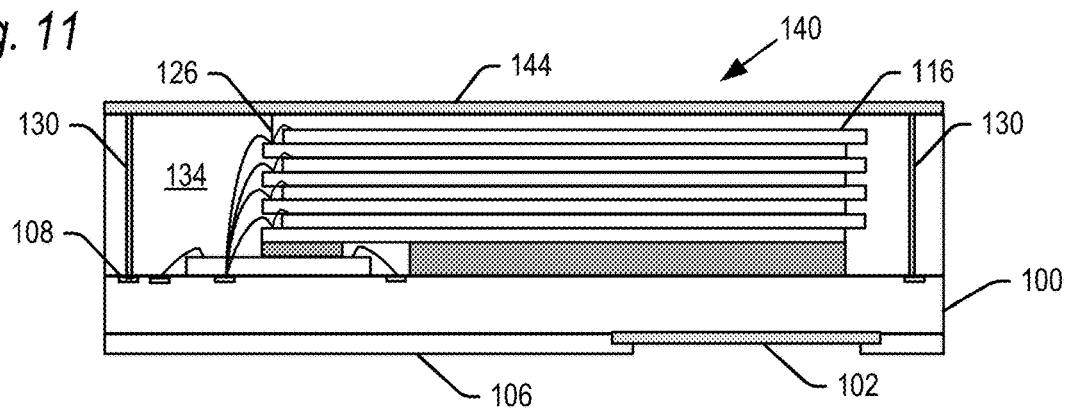
FIG. 11 is an edge view of a semiconductor device at another step during fabrication process according to an embodiment of the present technology.

In step 224, a conductive layer 144 is formed on top of the upper surface 136 of the mold compound 134 as shown in FIG. 11. The conductive layer 144 may be formed of copper or copper alloys, plated copper or plated copper alloys, Alloy 42 (42Fe/58Ni), copper plated steel, or other metals and materials suitable for use as contact fingers. In embodiments, the conductive layer 144 may be formed in a process which is the same as or similar to processes for forming an EMI (electromagnetic interference) shield on the surface of a mold compound.

Figure 12:
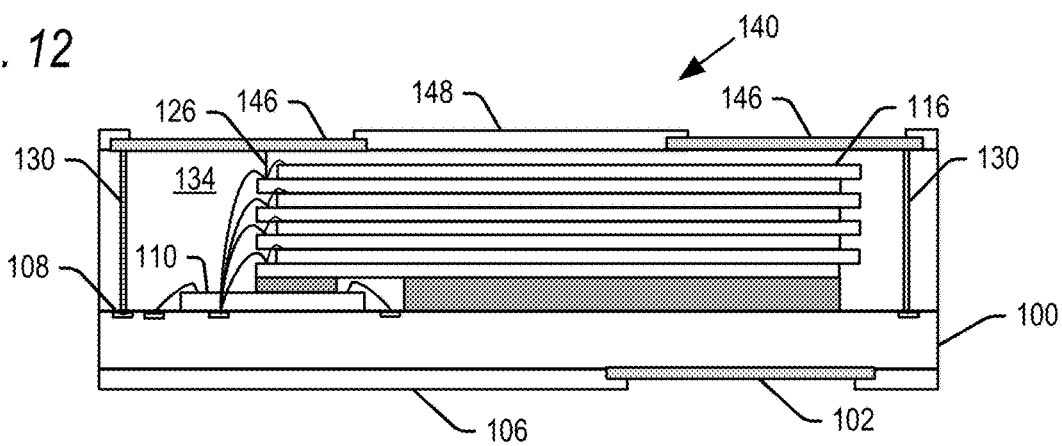
FIG. 12 is an edge view of a completed semiconductor device according to an embodiment of the present technology.
Figure 13:
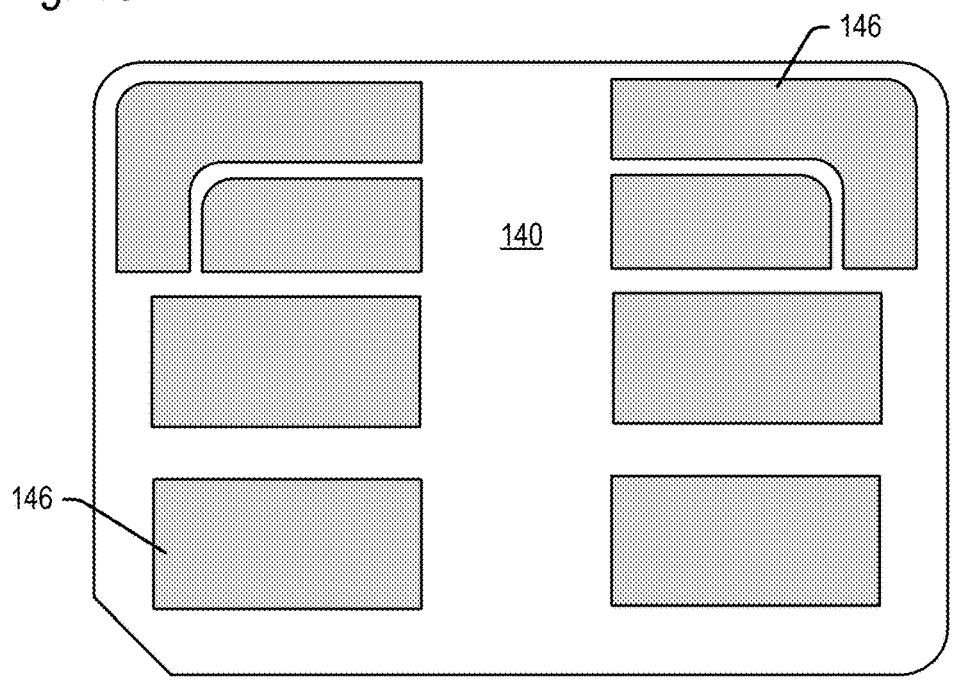
FIG. 13 is a top view of a completed semiconductor device according to an embodiment of the present technology.

In step 226, the conductive layer 144 may be patterned into a second set of contact fingers 146 as shown in the side view of FIG. 12 and the top view of FIG. 13. The contact fingers 146 be formed from conductive layer 144 in various processes including for example photolithographic processes. The number, shape and relative positions of the contact fingers 146 shown in FIGS. 12 and 13 is by way of example only and may vary in further embodiments. The contact fingers 146 may be provided to support any of a wide variety of memory cards standards including for example multimedia cards (MMC), Nano cards, SIM cards, etc., and may be configured according to any of a wide variety of bus standards including for example SD and the PCIe bus standards.

In the embodiments shown in FIGS. 12 and 13, the contact fingers 146 may be provided on both halves of the top surface of the semiconductor device 140. However, it is conceivable that the contact fingers 146 be provided on only one half, or distributed in a variety of other patterns, in further embodiments. Where on only one half, one of the sets of electrical connectors 130 (the left or right set from the perspective of FIG. 12) may be omitted. A layer of solder mask or other protective coating 148 may be formed on the top surface of the device 140, leaving the contact fingers 146 exposed, to complete fabrication of the semiconductor device 140.

In use, the semiconductor device 140 may be an LGA semiconductor device configured for removable insertion into a host device such as for example a cell phone, computer or camera. The host device insertion slot may include a first set of contact pins on the bottom of the slot configured to mate with the first set of contact fingers 102 on a bottom surface of the semiconductor device 140. The host device insertion slot may further include a second set of contact pins on the top of the slot configured to mate with the second set of contact fingers 146 on a top surface of the semiconductor device 140.

As noted above, the first set of contact fingers 102 may be electrically coupled to the controller die 110 and/or memory dies 116 through electrical traces and vias in and through the substrate 100. Upon insertion into the host device slot and mating with the first set of contact pins, the first set of contact fingers 102 enable communication between the host device and the semiconductor device 140.

As noted above, the second set of contact fingers 146 may be electrically coupled to the controller die 110 and/or memory dies 116 through the vertical electrical connectors 126 and/or 130, and through electrical traces and vias in and through the substrate 100. Upon insertion into the host device slot and mating with the second set of contact pins, the second set of contact fingers 146 enable communication between the host device and the semiconductor device 140.

As noted in the Background section, it may be difficult to design a semiconductor device where contact fingers cover the entire bottom surface of the device. The present technology provides technical advantages in greatly increasing the flexibility as to where contact fingers may be placed by doubling the surface area available for the contact fingers. Additionally, where needed, the present technology provides technical advantages in greatly increasing be available surface area where contact fingers may be placed.

In summary, in one example, the present technology relates to a semiconductor device, comprising: a substrate comprising first and second opposed surfaces; a first set of one or more contact fingers on the first surface of the substrate; at least one semiconductor die mounted on the second surface of the substrate and electrically coupled to the substrate; a molding compound encapsulating the at least one semiconductor die; a second set of one or more contact fingers on a surface of the molding compound; and one or more electrical connectors physically extending between the second set of one or more contact fingers and at least one of the substrate and the at least one semiconductor die.

In a further example, the present technology relates to a land grid array semiconductor device configured for removable insertion to and from a host device, the land grid array semiconductor device comprising: a substrate; at least one semiconductor die mounted on the substrate and electrically coupled to the substrate; a molding compound encapsulating the at least one semiconductor die; a surface of the substrate and a surface of the molding compound defining first and second opposed major surfaces of the land grid array semiconductor device; a first set of one or more contact fingers on the first surface of the land grid array semiconductor device and electrically coupled to the substrate; a second set of one or more contact fingers on the second surface of the land grid array semiconductor device; and one or more electrical connectors physically extending between the second set of one or more contact fingers and at least one of the substrate and the at least one semiconductor die.

In another example, the present technology relates to land grid array semiconductor device configured for removable insertion to and from a host device, the land grid array semiconductor device comprising: a substrate comprising first and second opposed surfaces; a first set of contact finger means, on a first surface of the land grid array semiconductor device, for interfacing with pins of the host device; at least one semiconductor die mounted on the second surface of the substrate and electrically coupled to the substrate; a molding compound encapsulating the at least one semiconductor die; a second set of contact finger means, on a surface of the molding compound defining a second surface of the land grid array semiconductor device, for interfacing with pins of the host device; and electrical connector means, physically extending between the second set of one or more contact fingers and at least one of the substrate and the at least one semiconductor die, for electrically connecting the second set of contact finger means within the land grid array semiconductor device.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a substrate comprising first and second opposed surfaces;
   a first set of one or more contact fingers on the first surface of the substrate;
   a plurality of semiconductor dies mounted on the second surface of the substrate and electrically coupled to the substrate, the plurality of semiconductor dies comprising:
   one or more flash memory dies, and
   a controller die mounted in an area on the second surface of the substrate;
   a molding compound encapsulating the plurality of semiconductor dies;
   a second set of one or more contact fingers on a surface of the molding compound; and
   one or more electrical connectors physically extending between the second set of one or more contact fingers and one or more of the substrate and the plurality of semiconductor dies;
   wherein the first surface of the substrate is devoid of contact fingers from the first set of contact fingers in an area opposed to the area on the second surface of the substrate comprising the controller die.

2. The semiconductor device of claim 1, wherein the one or more electrical connectors comprise a vertical wire.

3. The semiconductor device of claim 1, wherein the one or more electrical connectors comprise a vertical column of conductive material.

4. The semiconductor device of claim 1, wherein the one or more electrical connectors comprise one or more solder balls.

5. The semiconductor device of claim 1, wherein the one or more electrical connectors extend between the second set of one or more contact fingers and an uppermost semiconductor die of the plurality of semiconductor dies.

6. The semiconductor device of claim 1, wherein the one or more electrical connectors extend between the second set of one or more contact fingers and the substrate.

7. The semiconductor device of claim 1, wherein the second set of one or more contact fingers comprise a plurality of contact fingers on two halves of the surface of the molding compound.

8. The semiconductor device of claim 1, wherein the second set of one or more contact fingers comprise a plurality of contact fingers on one half of the surface of the molding compound.

9. A land grid array semiconductor device configured for removable insertion to and from a host device, the land grid array semiconductor device comprising:
 a substrate;
 at least one semiconductor die mounted on the substrate and electrically coupled to the substrate, each of the at least one semiconductor dies comprising a plurality of die bond pads;
 a molding compound encapsulating the at least one semiconductor die;
 a surface of the substrate and a surface of the molding compound defining first and second opposed major surfaces of the land grid array semiconductor device;
 a first set of one or more contact fingers on the first surface of the land grid array semiconductor device and electrically coupled to the substrate;
 a second set of one or more contact fingers on the second surface of the land grid array semiconductor device; and
 a plurality of bond wires electrically coupling the at least one semiconductor die to the substrate, a set of one or more bond wires of the plurality of bond wires further electrically coupling the second set of one or more contact fingers and one or more of the die bond pads on a semiconductor die of the at least one semiconductor die.

10. The semiconductor device of claim 9, wherein the land grid array semiconductor device is configured according to one of the SD card, Nano card, Multimedia card and SIM card standards.

11. The semiconductor device of claim 9, wherein the land grid array semiconductor device is configured according to one of the SD and the peripheral component interconnect express bus standards.

12. The semiconductor device of claim 9, wherein the land grid array semiconductor device is configured according to one of the SD card, Nano card, Multimedia card and SIM card standards.

13. The semiconductor device of claim 9, wherein the set of one or more bond wires extend between the second set of one or more contact fingers and the die bond pads of an uppermost semiconductor die of the at least one semiconductor die.

14. The semiconductor device of claim 9, further comprising one or more electrical connectors extending between the second set of one or more contact fingers and the substrate.

15. The semiconductor device of claim 9, wherein the at least one semiconductor die comprises a controller die mounted in an area on a first surface of the substrate, and wherein the first surface of the land grid array semiconductor device is devoid of contact fingers from the first set of contact fingers in an area opposed to the area on the first surface of the substrate comprising the controller die.

16. A land grid array semiconductor device configured for removable insertion to and from a host device, the land grid array semiconductor device comprising:
 a substrate comprising first and second opposed surfaces;
 a first set of contact finger means, on a first surface of the land grid array semiconductor device, for interfacing with pins of the host device;
 a plurality of semiconductor dies mounted on the second surface of the substrate and electrically coupled to the substrate, the plurality of semiconductor dies comprising:
  one or more flash memory dies, and
  a controller die mounted in an area on the second surface of the substrate;
 a molding compound encapsulating the plurality of semiconductor dies;
 a second set of contact finger means, on a surface of the molding compound defining a second surface of the land grid array semiconductor device, for interfacing with pins of the host device; and
 electrical connector means, physically extending between the second set of one or more contact fingers and one or more of the substrate and the plurality of semiconductor dies, for electrically connecting the second set of contact finger means within the land grid array semiconductor device;
 wherein the first surface of the substrate is devoid of contact fingers from the first set of contact fingers in an area opposed to the area on the second surface of the substrate comprising the controller die.

* * * * *